(12) United States Patent
Ashiwake et al.

(10) Patent No.: US 6,292,365 B1
(45) Date of Patent: Sep. 18, 2001

(54) ELECTRONIC APPARATUS

(75) Inventors: Noriyuki Ashiwake, Tsuchiura; Toshio Otaguro, Ibaraki-ken; Atsuo Nishihara, Kashiwa; Mitsuru Honma, Ibaraki-ken, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/398,036

(22) Filed: Sep. 17, 1999

(30) Foreign Application Priority Data

Sep. 18, 1998 (JP) .................................................. 10-264304

(51) Int. Cl.⁷ ...................................................... H05K 7/20
(52) U.S. Cl. .......................... 361/700; 361/710; 361/719; 165/104.21; 62/259.2
(58) Field of Search ..................... 361/700–710, 361/713–724, 683–689, 699; 165/80.4, 104.21, 104.22, 104.24, 104.33, 80.2, 80.3, 165; 257/713–715, 706–727; 174/16.1, 15.1, 16.3, 252; 219/200, 201, 209, 210; 62/259.2, 150, 51.1, 51.2

(56) References Cited

U.S. PATENT DOCUMENTS

| | | | | |
|---|---|---|---|---|
| 4,263,965 | * | 4/1981 | Mansuria et al. | 165/80 C |
| 4,279,292 | * | 7/1981 | Swiatosz | 165/32 |
| 4,374,316 | * | 2/1983 | Inamori et al. | 219/209 |
| 4,561,006 | * | 12/1985 | Currie | 357/28 |
| 4,950,181 | * | 8/1990 | Porter | 439/485 |
| 5,126,829 | * | 6/1992 | Daikoku et al. | 357/82 |
| 5,331,273 | * | 7/1994 | Schneider | 324/158.1 |
| 5,539,186 | * | 7/1996 | Abrami et al. | 219/548 |
| 5,574,627 | * | 11/1996 | Porter | 361/719 |
| 6,054,676 | * | 4/2000 | Wall et al. | 219/209 |

FOREIGN PATENT DOCUMENTS

| | | | | |
|---|---|---|---|---|
| 000444570A2 | * | 9/1991 | (EP) | G06F/1/20 |
| 1-236699 | | 9/1989 | (JP) . | |
| 401236699A | * | 9/1989 | (JP) | H05K/7/20 |
| 5-152779 | | 6/1993 | (JP) . | |
| 6-119083 | | 4/1994 | (JP) . | |

* cited by examiner

Primary Examiner—Leo P. Picard
Assistant Examiner—Michael Datskovsky
(74) Attorney, Agent, or Firm—Antonelli, Terry, Stout & Kraus, LLP

(57) ABSTRACT

It is an object of the invention to provide a cooler of an electronic apparatus capable of keeping semiconductor chips at a low temperature without care of condensation and which is excellent in compactness. To achieve the above object, the present invention proposes an electronic apparatus in which a heating region is built in the multilayered wiring substrate of the semiconductor package or module on the side near to the input/output pins, the semiconductor package or module and the cooler mounted on the package or module are placed in a moisture proof case, a heat insulating material is filled in the gaps between the moisture proof case, semiconductor package or module and cooler, and a heater is provided on the outer periphery of the heat insulating material.

17 Claims, 4 Drawing Sheets

ELECTRONIC APPARATUS

BACKGROUND OF THE INVENTION

The present invention relates to electronic apparatus, and particularly to prevention of dew condensation on the semiconductor devices within electronic apparatus.

The electronic computer, or so-called computer can be roughly classified into three groups: personal computer for private use, work station for technical computation and relatively small-scale database management, and large general-purpose computer for management of large-scale database such as customer data in banks and telephone companies. The semiconductor devices incorporated in these computers are cooled in various ways. Some personal computers employ natural convective air cooling without use of fans. The other personal computers, work stations and most large computers generally use forced convective air cooling in order for the heat generating devices. However, high-performance large computers use a liquid-circulation cooling systems.

The present invention is based on the results of examination about the liquid cooling in large computers. In recent years, the amount of information of database which the large computer handles increases year by year, while speeding up of services and supply of much information have been requested. In order to meet these demands, it is necessary to improve the processing ability of the central processing unit of the large computer that handles enormous amount of data. However, when the processing ability is improved, the semiconductors in the central processing unit increase the amount of heat generation. Thus, the semiconductor devices are forced to be cooled by a liquid such as water. Recently, electronic apparatus using CMOS device have been widely used.

The CMOS device can increase the operation speed as the temperature decreases, and thus it is required to be cooled to a low temperature. For example, it should be cooled by the refrigerator unit that is used in an air conditioner. However, in order to cool the CMOS chip to 10° C., it is necessary that the refrigerator unit be operated to cool at a temperature as low as, for example, 0° C. Cooling at a low temperature will cause condensation of dew on the peripheral equipment around the semiconductor modules kept at low temperatures.

There is a known electronic-equipment cooler for cooling semiconductor packages or semiconductor modules by use of a refrigerator unit, as disclosed in, for example, JP-A-1-236699. In this prior art, a sealed-up box is provided in which the semiconductor module is placed, and a dehumidifier unit and heater unit are connected to this box. In addition, JP-A-6-119083 discloses another structure having a heat-insulated small chamber in which a refrigerator unit and CPU board are mounted. When this CPU board is changed by another one, the temperature within the chamber is raised to prevent the condensation by a heater enclosed in the single chamber. This heater constitutes a cooling unit, and controls the air within the chamber not to form dew. Moreover, JP-A-5-152779 describes still another structure in which electric resistors that generate heat by current are printed on a circuit board in order to raise the temperature of the circuit board over the dew point temperature by the heat generation.

The electronic apparatus has a cooler for cooling the semiconductor package or semiconductor module by a refrigerator unit, therefore the semiconductor chips can be kept at a low temperature. However, when the temperature of the package or module is different from that of the air surrounding it, dew condenses on it. The semiconductor chips themselves do not cause dew condensation because they are incorporated within a sealed space with inert gas enclosed. However, the semiconductor package or semiconductor module has pins mounted for input and output of data, and thus condensation of dew on these pins will generate serious problems such as short-circuits, signal transmission failure and corrosion. Even if dew does not condense on the pins themselves, dew condensing on other portions of the package or module may drip to become contact with the pins.

Two methods of preventing the condensation can be considered. The first method is to control the state of air around the semiconductor package or module to lower the dew point temperature as described in the prior arts (JPA No. 1-236699, and JPA No. 6-119083). The second method is to control the surface temperature of the semiconductor package or module to rise over the dew point temperature as disclosed in JPA No. 5-152779. The first method, however, requires an apparatus for controlling the humidity of air within an airtight chamber that houses all the semiconductor package or module and the printed wiring board with these package or module mounted.

The second method is to raise the temperature of the whole circuit board over the dew point temperature, but does not consider to keep the semiconductor devices at a low temperature. Moreover, a third method can be used in which a heat-insulating material is provided around the semiconductor package or module. However, when the semiconductor package or module is of multi-chip type, a great number of pins must be provided on the entire surface of the input/output pin side of the multilayered wiring board. Thus, there is not space to mount the heat-insulating material on that large number of pins. Also, it is difficult to mount the condensation preventing means such as a heater.

SUMMARY OF THE INVENTION

It is an object of the invention to provide electronic apparatus that does not need to care about condensation of dew even if the semiconductor chips are maintained at low temperatures.

The above object can be achieved by providing an electronic apparatus having a cooler of a refrigerating unit, and a semiconductor module made in thermal contact with this cooler, wherein the cooler and the semiconductor module are covered with a heat insulating material, and a heater is provided on the outer periphery of this heat-insulating material.

The above object can also be achieved by providing an electronic apparatus having a cooler of a refrigerating unit, and a semiconductor module made in thermal contact with this cooler, wherein the cooler and the semiconductor module are covered with a heat insulating material, a heater is provided on the outer periphery of this heat-insulating material, and heat generating means is provided within a circuit wiring substrate of this semiconductor module.

In addition, the above object can be achieved by providing an electronic apparatus having a cooler of a refrigerating unit, and a semiconductor module made in thermal contact with this cooler, wherein semiconductor chips are mounted on a circuit wiring substrate of the semiconductor module, input/output pins are provided on the circuit wiring substrate, and a heater is provided within the substrate on the input/output pin side.

Moreover, the above object can be achieved by using a glass ceramic substrate for the circuit wiring substrate.

DESCRIPTION OF THE EMBODIMENTS

Figure 1:
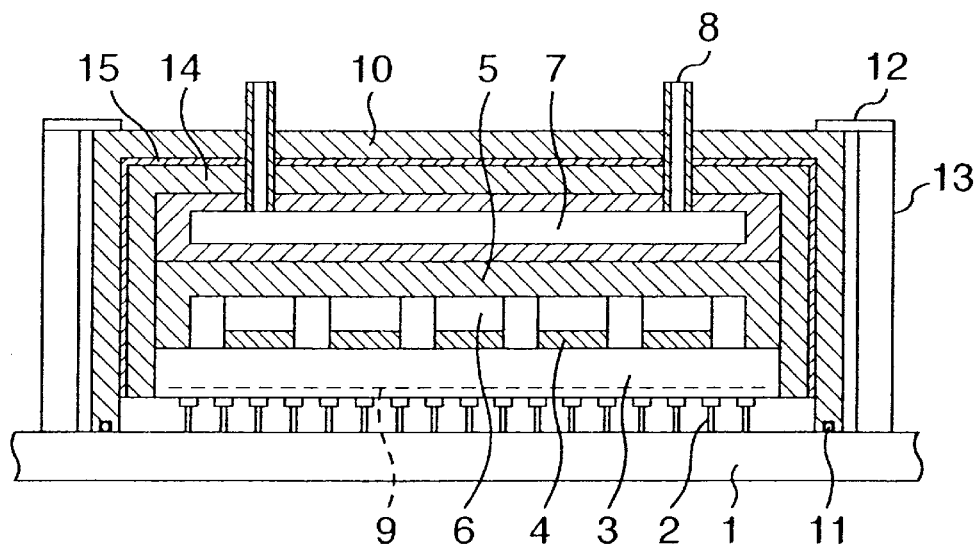
FIG. 1 shows one embodiment of the invention.

One embodiment of the invention will be described with reference to FIG. 1. FIG. 1 is a cross-sectional view of a cooler and semiconductor module. Referring to FIG. 1, there is shown a large printed wiring board 1 called mother board. On this board 1 there is mounted a ceramic multilayered wiring substrate 3 having a large number of input/output pins 2. The ceramic multilayered substrate 3 may be made of, preferably, glass ceramic, mullite or the like. The ceramic multilayered substrate 3 has a plurality of semiconductor chips 4 mounted thereon. The elements-mounted side of the ceramic substrate 3 is sealed with a module cap 5, and generally an inert gas such as nitrogen is enclosed within the sealed space. A thermal conductor 6 for conducting heat from chip 4 to module cap 5 is provided between each of the semiconductor chips 4 and the module cap 5. The ceramic substrate 3, semiconductor chips 4, thermal conductors 6 and module cap 5 constitute a single semiconductor module. A cooler 7 is mounted on the module cap 5, and a coolant is supplied/discharged through a pipe 8 to/from the cooler 7. Within the ceramic substrate 3 there is provided a heating region 9 on the side near to the input/output pins 2. The semiconductor module is covered with a moistureproof case 10, which is made of, for example, a metal material such as aluminum. This case 10 is connected to the mother board 1 at a sealing portion 11, thus forming a closed space. The case 10 is secured to the mother board 1 through a fixing plate 12 and a securing portion 13. Shown at 14 is a heat insulating material that is filled between the semiconductor module and the case. The heat insulating material 14 may be expanded urethane or silicon foam. Shown at 15 is a heater that is provided on the outer periphery of the heat insulating material 14.

According to this embodiment, the heating region is built in the ceramic substrate 3 as follows. The ceramic substrate 3 can have three-dimensional conductors formed therein by laminating sheets called green sheets with printed wiring patterns and sintering those green sheets. The conductors on the different layers are connected through through-hole conductors formed in the thickness direction. The heating region is built in this ceramic multilayered substrate 3 by providing a single heater layer 9 on the side near to the input/output pins 2.

Figure 2:
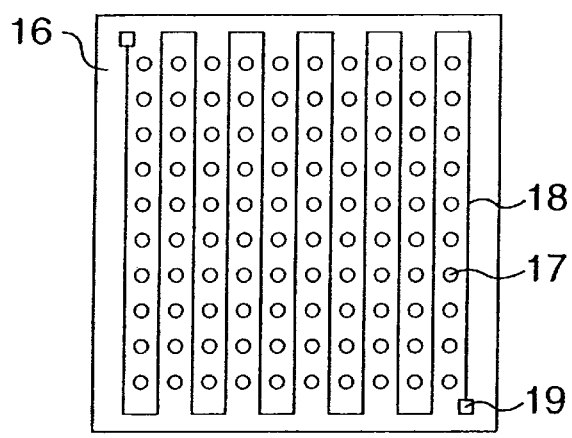
FIG. 2 is a plan view of a green sheet.
Figure 3:
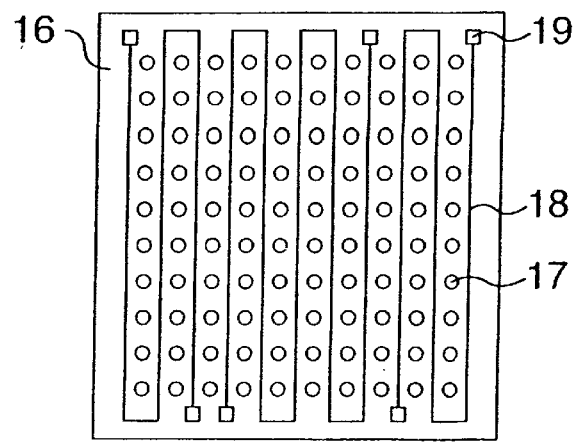
FIG. 3 is a plan view of another green sheet.

FIGS. 2 and 3 are front views of the green sheet. Referring to FIG. 2, a heater 18 and electrodes 19 are formed on the inner side of a green sheet 16 in such a manner as to keep away from the through-holes 17. This green sheet is attached as the outermost layer to the other sheets for the ceramic substrate 3 and sintered together so that the heater layer 9 can be built in the ceramic substrate 3. The heater may be continuous as illustrated in FIG. 2 or divided to be separate within arbitrary ranges as shown in FIG. 3.

According to this embodiment, the heat generated from the semiconductor chips 4 is transmitted through the thermal conductors 6 to the module cap 5 and then to the cooler 7. When the temperature of the coolant supplied to the cooler 7 is sufficiently reduced, the semiconductor chips 4 can be maintained at a low temperature. Since the semiconductor elements formed on the chips are cooled to a low temperature, they can operate at a high speed. In addition, since the semiconductor chips are made in contact with the inert gas, dew condensation is not caused on the semiconductor chips 4 themselves even if they are cooled to a low temperature.

The flow of heat passing through the ceramic multilayered substrate is expressed by the following equation.

$$Q = A\lambda \Delta T / \Delta Z \ldots \quad (1)$$

where Q is the amount of heating in the heating region, $\lambda$ is the thermal conductivity of the ceramic substrate, $\Delta T$ is the temperature difference in the thickness direction of the ceramic substrate, and $\Delta Z$ is the thickness of the ceramic substrate. From the equation (1), it will be seen that the amount of heating, Q necessary for the same temperature difference $\Delta T$ decreases with the decrease of the thermal conductivity $\lambda$. Of various different ceramic substrates, the glass ceramic substrate and mullite substrate have thermal conductivity as small as 1.8 W/mK, 3.8 W/mK, respectively. Therefore, when these substrate materials are used under a relatively small amount of heating Q, a large temperature difference $\Delta T$ can be produced, and thus the temperature of the ceramic substrate on the input/output pins side can be increased while the semiconductor chips are kept at a relatively low temperature. When a glass ceramic substrate of, for example, 100 mm square, 5 mm in thickness is used, the amount of heating necessary for a temperature difference of 10° C. is about 37 W. This amount of heating is normally 10% or below of the total amount of heat generated from the whole semiconductor module, and thus can be said to be considerably small. Accordingly, by controlling the amount of heating in this heating region, it is possible to control the temperature of the ceramic substrate on the input/output pins side while the semiconductor chips are kept at a low temperature.

That is, according to this embodiment, since the heating region is built in the ceramic substrate on the side near to the input/output pins, the temperature distribution produced within the ceramic substrate can be used, or the temperature of the input/output pins can be increased over the dew point while the semiconductor chips are kept at a low temperature. When the heater built in the ceramic substrate is divided into some portions, more precise temperature control can be achieved by the combination with temperature detection means. In addition, since the heating region is built in the multilayered substrate in this embodiment, a very fine heater pattern can be produced, and thus the temperature of the input/output pins can be easily controlled even if the density of the number of input/output pins is large as in the multichip structure.

The action of case 10, heat insulating material 14 and heater 15 around the module will be described below. The case 10 forms a closed space together with the seal portion 11 and mother board 1. The heat insulator 14 provided inside the case 10 is thus cut off from the surrounding air. Therefore, even if a slight amount of water initially contained in the air inside the heat insulator 14 condenses on the surface of the cooler and so on, the condensation does not progress to the outside.

The action of the heater provided on the outer periphery of the heat insulator is as follows. The surface temperature of the heat insulator (substantially the same as that of the case) $T_s$ can be expressed by $$T_s=(Y_a T_c+Y_\infty+Q)/(Y_a+Y_\infty) \ldots \quad (2)$$

where $T_c$ is the temperature inside the heat insulator (low-temperature side), $T_\infty$ is the ambient temperature, and Q is the amount of heating of the heater. $Y_a$ and $Y_\infty$ are respectively thermal conductance of the heat insulating material and surrounding air, and can be expressed by $$Y_a=A_a \lambda_a/\Delta Z_a \ldots \quad (3)$$

$$Y_\infty=A_a h \ldots \quad (4)$$

where $A_a$ is the area of the heat insulating material, $\lambda_a$ is the thermal conductivity of the heat insulating material, $\Delta Z_a$ is the thickness of the heat insulator, and h is the heat transfer coefficient from the case to the surrounding air.

Figure 4:
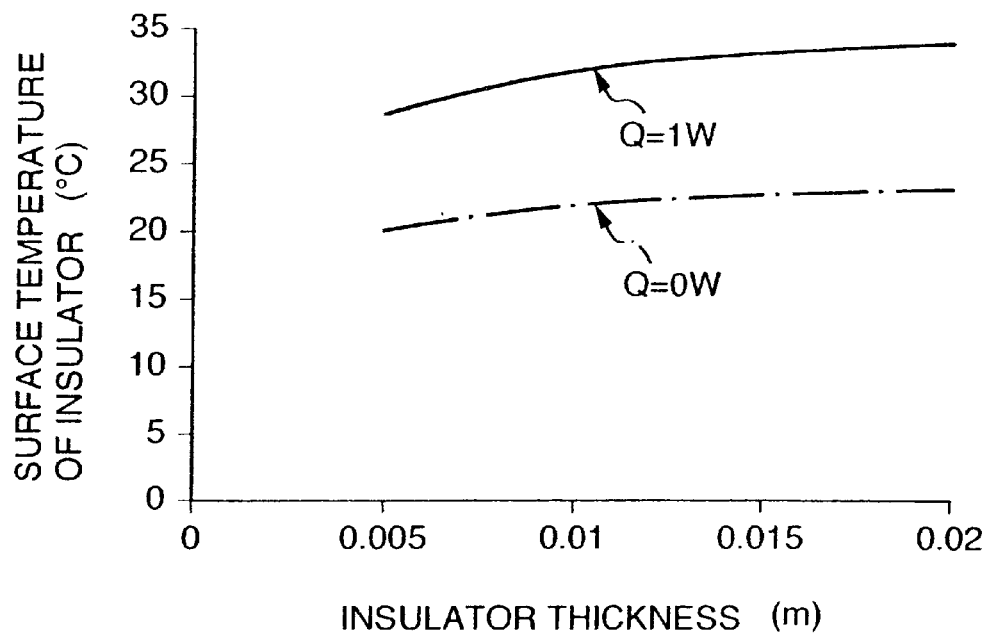
FIG. 4 is a graph showing the effect of a heater on the outer periphery of the heat insulator.

FIG. 4 is a graph showing the effect of the heater on the outer periphery of the heat insulating material. This graph shows the relation between the thickness of the heat insulator and the temperature of the surface of the heat insulator (the case) with the amount of heating Q changed as a parameter. In this case, the curves were plotted under the conditions of $A_a=0.01$ m$^2$, $\lambda_a=0.018$ W/mK (expanded urethane), h=8.7 W/m$^2$K (wind velocity 0.5 m/s), $T_c=10°$ C., $T_\infty=25°$ C. From the graph, it will be seen that with no heating the surface temperature of the heat insulating material increases with the increase of the thickness, but does not exceed 24° C. even at a thickness of 20 mm. When the heater operates to generate heat, however, the surface temperature of the heat insulator (case temperature) can be increased up to 29° C. at a thickness of 5 mm under heating of only 1 W. In other words, by providing a heater on the outer periphery of the heat insulating material, it is possible to easily control the surface temperature of the heat insulating material to increase over the dew point of the surrounding air while the thickness of the heat insulating material is much reduced as compared with the case where no heating is made.

Figure 5:
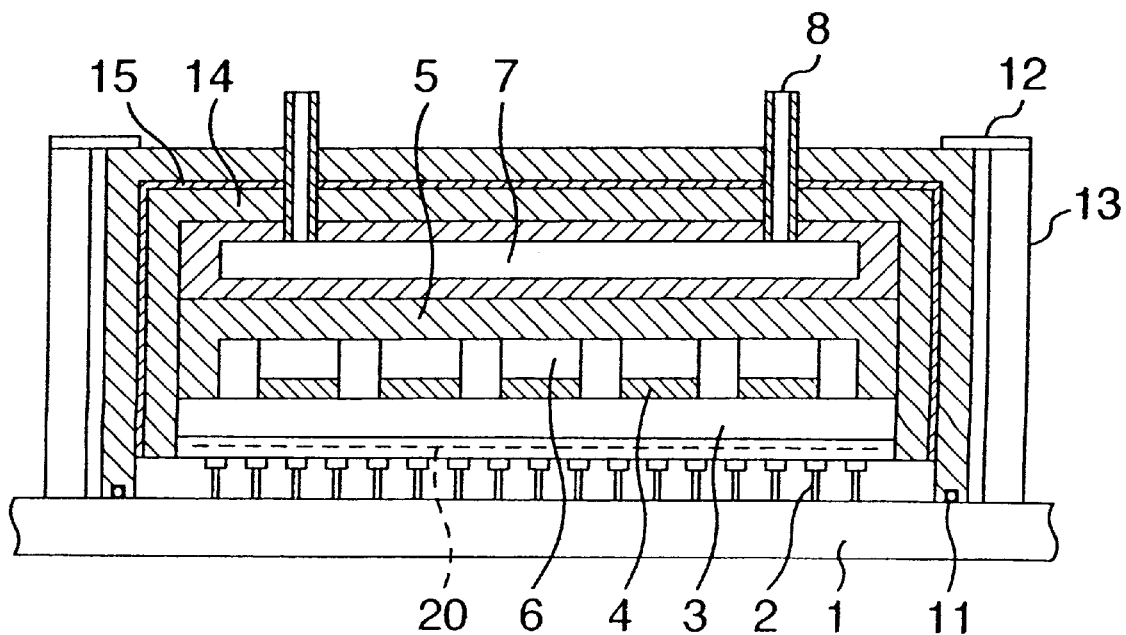
FIG. 5 shows another embodiment of the invention.

FIG. 5 shows another embodiment of the invention. A polyimide thin film 20 is provided in the ceramic substrate 3 on the side near to the input/output pins 2, and a heating region and temperature detector are formed in this thin film 20. The polyimide thin layer 20 can be easily formed as a multilayer by repeating the processes of electroplating, etching, coating of a polyimide film and polishing. Thus, the heating region and temperature detector can be easily built in the layers. According to this embodiment, since a large number of temperature detectors can be built in, the temperature of the ceramic substrate on the input/output pin side can be more precisely controlled to increase over the dew point of the surrounding air.

Figure 6:
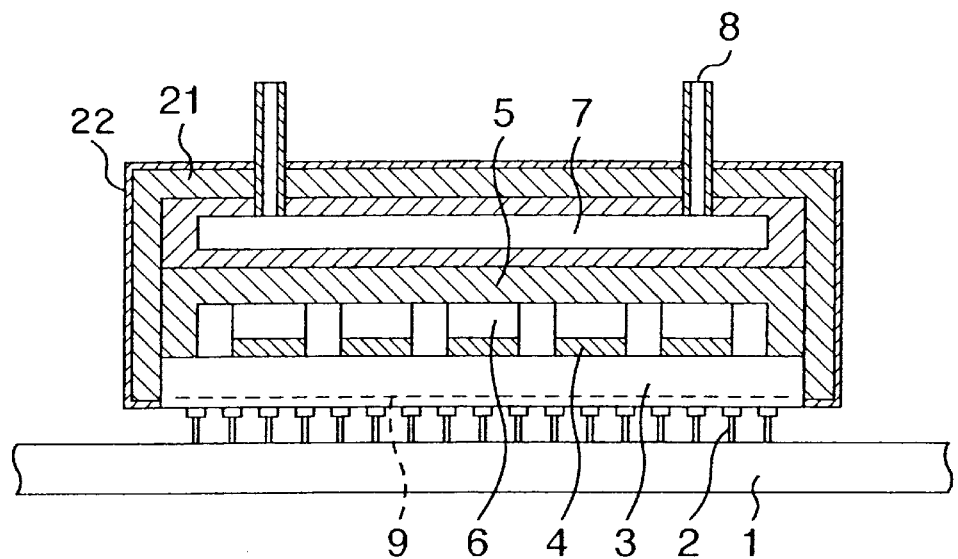
FIG. 6 shows still another embodiment of the invention.

FIG. 6 shows still another embodiment of the invention. A heat insulating material 21 is provided around the ceramic substrate 3, module cap 5 and cooler 7. A moistureproof film-shaped heater 22 is provided on the outer periphery of the heat insulating material. The film of the heater is made of, for example, polyimide. The film-shaped heater 22 can be easily produced by forming a heater pattern on a polyimide film and then sticking it to another polyimide film. According to this embodiment, there is no need to provide the securing portion 13 and fixing plate 12 through which the case 10 is mounted as compared with the embodiment shown in FIG. 1.

Figure 7:
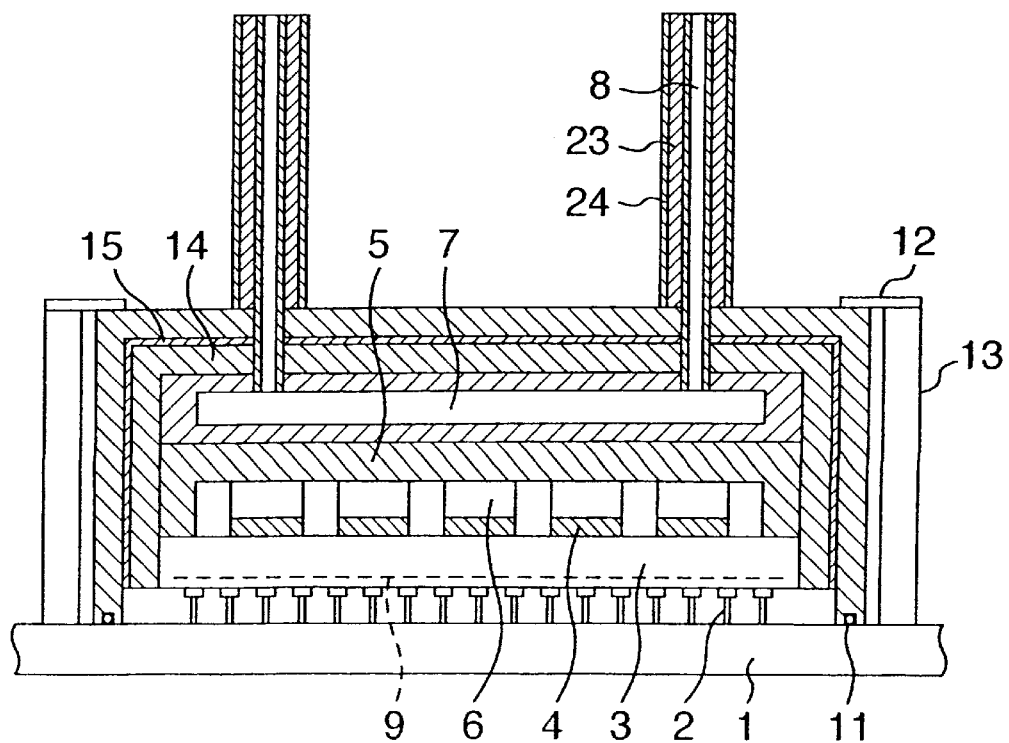
FIG. 7 shows still another embodiment of the invention.

FIG. 7 shows another embodiment of the invention. A heat insulating material 23 and moistureproof film-shaped heater 24 are also provided around the pipe 8 for supplying/discharging coolant to/from the cooler 7. Thus it is possible to prevent the condensation on the pipe 8, increasing the reliability of the apparatus.

Figure 8:
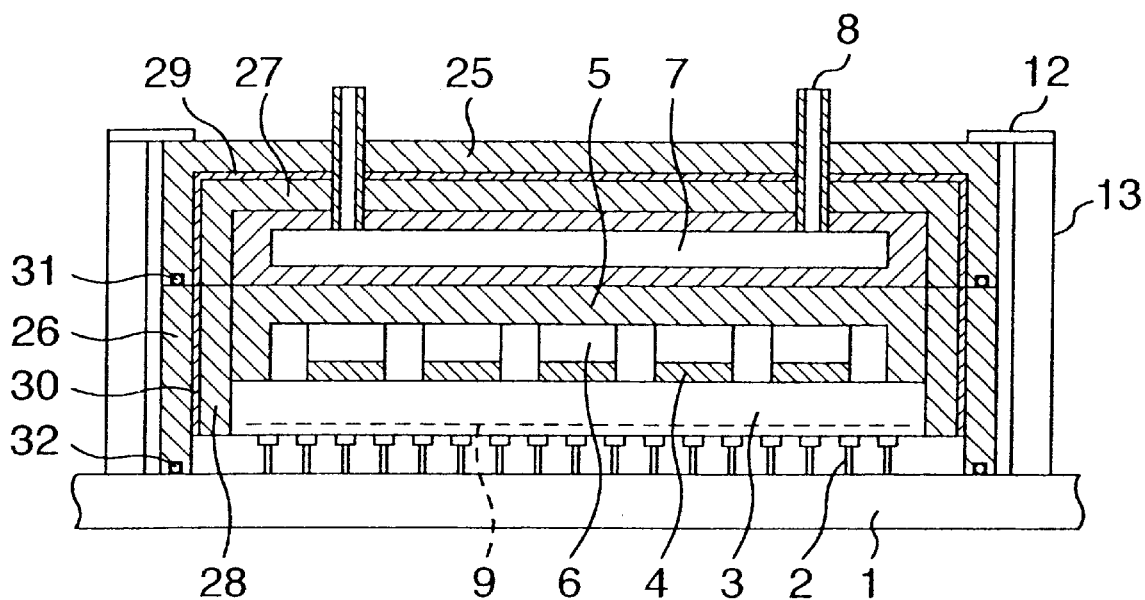
FIG. 8 shows further embodiment of the invention.

FIG. 8 shows still another embodiment of the invention. Cases (25, 26), heat insulating materials (27, 28) and heaters (29, 30) on the outer periphery of the heat insulators are respectively provided around the semiconductor package or module and around the cooler mounted thereon in a separate manner. In addition, a seal 31 is provided at the junction between the case 25 on the semiconductor package or module side and the case 26 on the cooler side. The cases 25, 26, seals 31, 32 and mother board 1 make a closed space. The semiconductor package or module sometimes needs maintenance operation, and at this time it is required to dismount from the mother board 1. In this maintenance operation, the cooler 7 must be first removed from the module cap 5. In that case, since this embodiment takes the structure in which the cases, heat insulators and heaters on the outer peripheries of insulators are respectively separately provided around the semiconductor package or module and around the cooler mounted thereon, the removal operation can be performed with ease.

Figure 9:
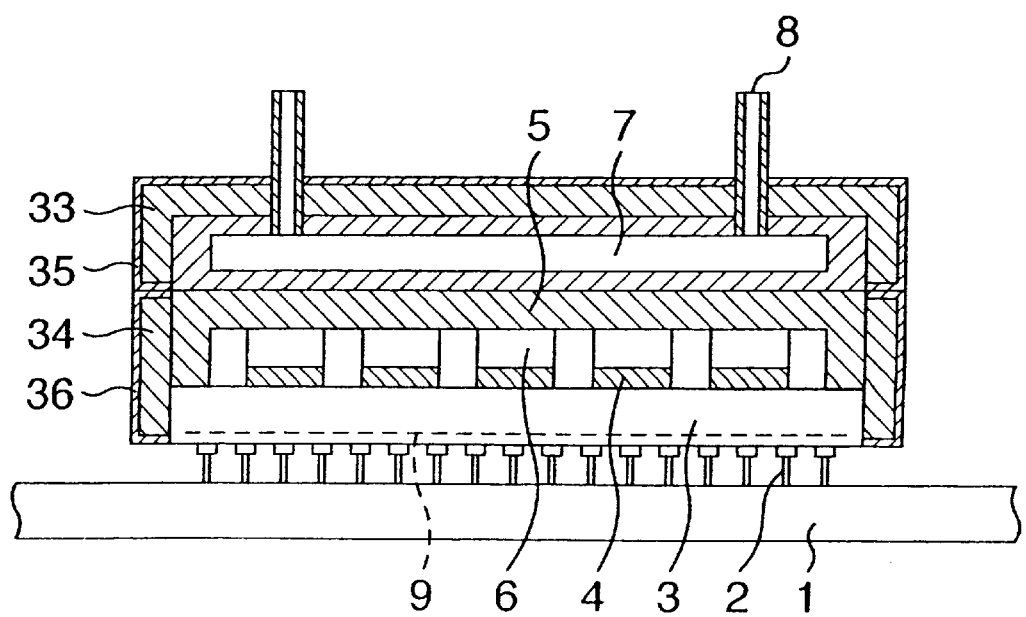
FIG. 9 shows still further embodiment of the invention.

FIG. 9 shows further embodiment of the invention. Heat insulators 33, 34 and moistureproof film-shaped heaters 35, 36 on the outer peripheries thereof are respectively separately provided around the semiconductor package or module and around the cooler. Therefore, in the maintenance operation the cooler can be easily detached from the module cap.

According to the invention, by building a heating region in the multilayered wiring substrate of the semiconductor package or module on the side near the input/output pins and supplying a current to this heating region, it is possible to control the temperature of the input/output pins to be higher than the dew point of the surrounding air, and maintain the semiconductor chips at a low temperature by utilizing the temperature distribution produced on the multilayered wiring substrate.

What is claimed is:

1. An electronic apparatus comprising a cooler of a refrigerator unit, and a semiconductor module made in thermal contact with said cooler, wherein said cooler and said semiconductor module are covered with a heat insulator, a heater is provided on the outer periphery of said heat insulator, and heating means is provided in a layer of a multi-layered wiring substrate of said semiconductor module, said layer of said multi-layered wiring substrate having said heater being a layer disposed furthest from said semiconductor module.

2. An electronic apparatus comprising a cooler of a refrigerator unit, and a semiconductor module made in thermal contact with said cooler, wherein said semiconductor module has semiconductor chips mounted on a multi-layered wiring substrate, said multi-layered wiring substrate has input/output pins arranged on a surface thereof, and a heater is provided in an outermost layer of said multi-layered wiring substrate proximate to the surface of said multi-layered wiring substrate on which said input/output pins are arranged.

3. An electronic apparatus according to claim 2, wherein said multi-layered wiring substrate is a glass ceramic substrate.

4. An electronic apparatus according to claim 2, wherein said semiconductor module has semiconductor chips mounted on said multi-layered wiring substrate of said semiconductor module, said multi-layered wiring substrate being provided with input/output pins, and said heating means includes a heater member provided within said multi-layered wiring substrate on the side near to said input/output pins.

5. An electronic apparatus according to claim 2, wherein said multi-layered wiring substrate is mounted on a printed board by input/output pins so that said multi-layered wiring substrate is disposed between said semiconductor module and said printed board.

6. An electronic apparatus according to claim 2, wherein at least one layer of said multi-layered wiring substrate includes through-holes through which input/output pins are connected with wiring in said multi-layered wiring substrate, said heating means including at least one heater member formed in a pattern which is adjacent said through-holes of said at least one layer and which avoids said through-holes.

7. An electronic apparatus according to claim 6, wherein said heating means includes a plurality of said heater members.

8. An electronic apparatus according to claim 6, wherein said at least one heater member is provided within said wiring substrate on said layer of said wiring substrate having said through-holes at a side near to said input/output pins.

9. An electronic apparatus according to claim 8, wherein said multi-layered wiring substrate includes sintered laminated green sheets with printed wiring patterns.

10. An electronic apparatus according to claim 2, wherein said wiring substrate is mounted on a printed board by said input/output pins so that said multi-layered wiring substrate is disposed between said semiconductor chips and said printed board.

11. An electronic apparatus according to claim 2, wherein said multi-layered wiring substrate has through-holes through which said input/output pins are connected with wiring in said multi-layered wiring substrate, said heater including at least one heater member formed in a pattern which is adjacent said through-holes and which avoids said through-holes.

12. An electronic apparatus according to claim 11, wherein said heater includes a plurality of heater members.

13. An electronic apparatus according to claim 11, wherein said at least one heater member is formed in a pattern on said layer of said multi-layered wiring substrate having said through-holes and disposed at the side near to said input/out pins.

14. An electronic apparatus according to claim 13, wherein said multi-layered wiring substrate includes sintered laminated green sheets with printed wiring patterns.

15. An electronic apparatus comprising a cooler of a refrigerator unit, and a semiconductor module made in thermal contact with said cooler, wherein said semiconductor module has at least one semiconductor chip mounted on one surface of a multi-layered wiring substrate, said multi-layered wiring substrate having input/output pins arranged on an opposite surface of said multi-layered wiring substrate, and a heater being provided in said multi-layered wiring substrate at a position so as to enable a maximum temperature difference to exist between said one surface of said multi-layered wiring substrate on which said at least one semiconductor chip is mounted and said opposite surface of said multi-layered wiring substrate at which said input/output pins are arranged, said cooler and said heater enabling said one surface to be maintained at a lower temperature with respect to the temperature of said opposite surface.

16. An electronic apparatus according to claim 15, wherein said heater is provided in a layer of said multi-layered wiring substrate which is disposed furthest from said semiconductor module so as to maintain said opposite surface at a higher temperature than said one surface.

17. An electronic apparatus according to claim 16, wherein said heater maintains said opposite surface at which said input/output pins are arranged at a temperature so that said input/output pins are at a temperature higher than a dew point temperature of air surrounding said input/output pins.

* * * * *